United States Patent
Chang

(10) Patent No.: US 10,256,787 B2
(45) Date of Patent: Apr. 9, 2019

(54) PIEZOELECTRIC OSCILLATING DEVICE

(71) Applicants: SONOPRO CO.,LTD., Tainan (TW); DATRON PRODUCTS CO., LTD., Taipei (TW)

(72) Inventor: Chia-Ming Chang, Tainan (TW)

(73) Assignees: SONOPRO CO., LTD., Tainan (TW); DATRON PRODUCTS CO., LTD., Taipei (TW)

( * ) Notice: Subject to any disclaimer, the term of this patent is extended or adjusted under 35 U.S.C. 154(b) by 262 days.

(21) Appl. No.: 15/268,561

(22) Filed: Sep. 17, 2016

(65) Prior Publication Data

US 2018/0013399 A1 Jan. 11, 2018

(30) Foreign Application Priority Data

Jul. 5, 2016 (TW) .............................. 105121147 A

(51) Int. Cl.
*H03H 9/10* (2006.01)
*H03H 9/205* (2006.01)
*B06B 3/00* (2006.01)
*G10K 11/22* (2006.01)

(52) U.S. Cl.
CPC ................. *H03H 9/10* (2013.01); *B06B 3/00* (2013.01); *G10K 11/22* (2013.01); *H03H 9/205* (2013.01)

(58) Field of Classification Search
CPC .......... G10K 11/22; H03H 9/10; H03H 9/205; B06B 3/00
See application file for complete search history.

(56) References Cited

U.S. PATENT DOCUMENTS 3,895,688 A * 7/1975 Bouyoucos ............ G10K 11/22
181/0.5

* cited by examiner

*Primary Examiner* — Derek J Rosenau
(74) *Attorney, Agent, or Firm* — Maschoff Brennan

(57) ABSTRACT

Disclosed is a piezoelectric oscillating device, which comprises a multi-section guiding component and an oscillation generating component, the multi-section guiding component including a plurality of guiding units, each guiding unit having a hollow space, the plurality of guiding units being connected together along a longitudinal direction in such a manner that the hollow spaces are connected in series to form the multi-section guiding component, and a guiding channel is formed inside the multi-section guiding component by connecting the plurality of hollow spaces in series, the oscillation generating component including a housing unit and a piezoelectric component, the housing unit being connected to an end of the multi-section guiding component in the longitudinal direction, the piezoelectric component being disposed in a disposing space in the housing unit and oscillating via a control of a piezoelectric signal.

8 Claims, 4 Drawing Sheets

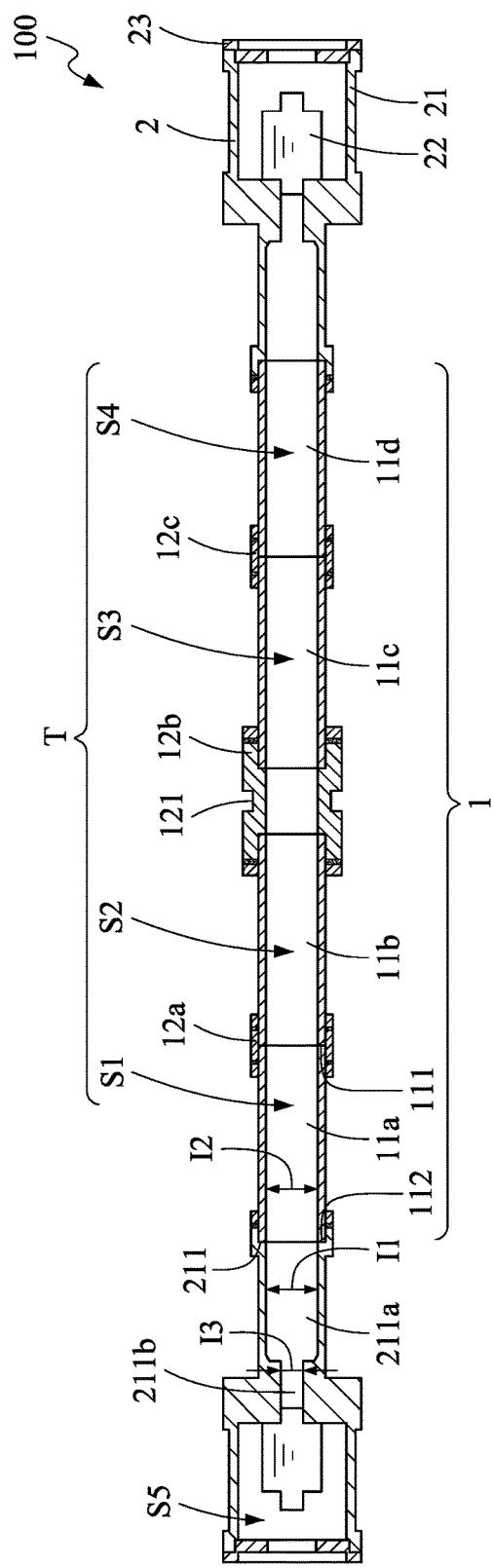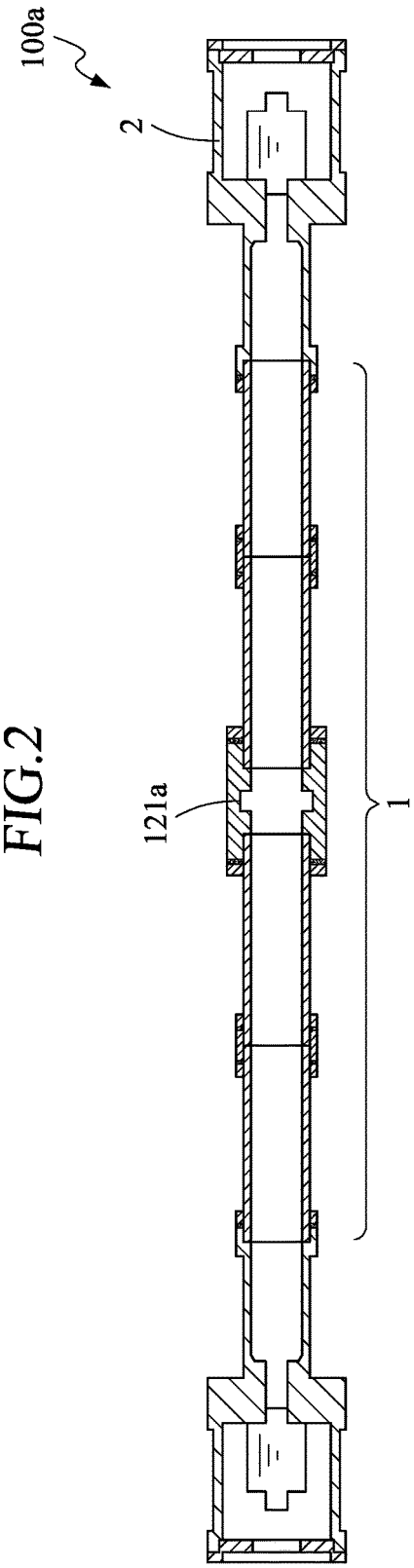
FIG.2
FIG.3

PIEZOELECTRIC OSCILLATING DEVICE

FIELD OF THE INVENTION

The present invention relates to a piezoelectric oscillating device, and more particularly to a multi-section piezoelectric oscillating device.

BACKGROUND OF THE INVENTION

The piezoelectric effect is a phenomenon of energy conversion between mechanical energy and electrical energy within certain materials such as piezoelectric ceramics as a common piezoelectric material which possesses excellent piezoelectric performance such that it is widely used in various piezoelectric devices, e.g., ultrasonic oscillator, ultrasonic motor, piezoelectric transformer and filters.

An ultrasonic oscillator can be applied to in technical fields including cleaning, emulsification and welding. In ultrasonic cleaning, it utilizes an element made of piezoelectric ceramics to oscillate in liquid at ultrasonic frequency of tens of thousands times per second such that the liquid is agitated to produce numerous cavitation bubbles which implode and release energy in such a manner that it performs cleansing action by penetrating and reaching the insides of deep slits and cracks to remove contaminants thereon, thereby obtaining a good cleaning effect. In ultrasonic emulsification, high frequency voltage signals are generated by electric circuits, then electric energy is converted into mechanical energy by transducers, and at last immiscible liquids are emulsified to form an emulsion. In ultrasonic welding, the area of a workpiece is contacted to be welded together by applying a welding head which exerts ultrasonic vibrations to the parts to be welded.

The basic structure of conventional ultrasonic oscillators (i.e. piezoelectric oscillator device) includes a cylindrical body which can be hollow or solid, and one end of the cylindrical body is connected to a piezoelectric device or both ends of the cylindrical body are respectively connected to two piezoelectric devices as a source for transmitting acoustic waves. When powered on, the piezoelectric device generates ultrasonic vibrations which travel through the cylindrical body. However, excessively strong acoustic waves and prolonged impact and oscillation may cause the ultrasonic oscillator to be damaged. As mentioned above, it is necessary to improve the conventional piezoelectric oscillating device.

SUMMARY OF THE INVENTION

Thus, an object of the present invention is to provide a piezoelectric oscillating device for extending the lifetime of piezoelectric oscillator devices.

The technical means adopted by the present invention to overcome the drawbacks in prior art provides a piezoelectric oscillating device, comprising:
a multi-section guiding component including a plurality of guiding units, each guiding unit having a hollow space, the plurality of guiding units being connected together along a longitudinal direction in such a manner that the hollow spaces are connected in series to form the multi-section guiding component, and a guiding channel is formed inside the multi-section guiding component by connecting the plurality of hollow spaces in series, and
an oscillation generating component including a housing unit and a piezoelectric component, the housing unit being connected to an end of the multi-section guiding component in the longitudinal direction, the piezoelectric component being disposed in a disposing space in the housing unit and oscillating via a control of a piezoelectric signal.

In one embodiment of the present invention, a piezoelectric oscillating device is provided, wherein the multi-section guiding component is provided with a connecting unit which connects the guiding units, and the connecting unit sleeves around ends of two adjacent guiding units such that every two adjacent guiding units are joined by one connecting unit.

In one embodiment of the present invention, a piezoelectric oscillating device is provided, wherein the connecting unit has a cushion structure portion which is a concave portion recessed from an outer wall surface of the connecting unit towards an inner wall surface of the connecting unit, or recessed from an inner wall surface of the connecting unit towards an outer wall surface of the connecting unit.

In one embodiment of the present invention, a piezoelectric oscillating device is provided, wherein the cushion structure portion is formed at the central portion of the multi-section guiding component in the longitudinal direction.

In one embodiment of the present invention, a piezoelectric oscillating device is provided, wherein the disposing space is in communication with atmosphere, and the oscillation generating component includes a shielding unit which is waterproof and with a shape corresponding to the disposing space, and the shielding unit is detachably disposed at an end of the oscillation generating component to cover the disposing space.

In one embodiment of the present invention, a piezoelectric oscillating device is provided, wherein the number of the oscillation generating components is two, and the two oscillation generating components are respectively connected to both ends of the multi-section guiding component in the longitudinal direction.

In one embodiment of the present invention, a piezoelectric oscillating device is provided, wherein the housing unit of the oscillation generating component includes a communication channel which communicates between the disposing space and the guiding channel in such a manner that the disposing space communicates with the guiding channel.

In one embodiment of the present invention, a piezoelectric oscillating device is provided, wherein the communication channel includes an extending part and a connecting part, and the extending part is in communication with the guiding channel and the connecting part communicates between the extending part and the disposing space, wherein an internal diameter of the extending part is equal to an internal diameter of the guiding channel, and an internal diameter of the connecting part is less than the internal diameter of the extending part.

In one embodiment of the present invention, a piezoelectric oscillating device is provided, wherein the communication channel includes an extending part and a connecting part, and the extending part is in communication with the guiding channel and the connecting part communicates between the extending part and the disposing space, wherein one end of the connecting part is in communication with the disposing space, and the other end of the connecting part extends divergently in width towards the extending part and is connected to the extending part, and an internal diameter of the extending part is equal to an internal diameter of the guiding channel, and an internal diameter of the connecting part is no greater than an internal diameter of the extending part.

In one embodiment of the present invention, a piezoelectric oscillating device is provided, wherein the housing unit of the oscillation generating component includes a sheathing recess portion, and the guiding unit at the end of the multi-section guiding component includes a sheathed protruding portion, the housing unit being connected to the multi-section guiding component by enabling the sheathing recess portion to sheath the sheathed protruding portion.

By the technical means used by the present invention, the multi-section guiding component with the multi-section structure (the combined plurality of guiding units) brings an effect of resonace when receiving piezoelectric signals, and the power and frequency generated from the multi-section guiding component are more stable compared to conventional piezoelectric oscillating devices, whereby the operation of the piezoelectric component is stabilized. In addition, the cushion structure portion diffracts the waves traveling through the plurality of guiding units rather than refracts them to thus change the wave forms such that the diffracted waves will not interfere with each other to reduce the impact on the whole piezoelectric oscillating device and prolong the lifetime thereof. Preferably, the cushion structure portion is formed at the central portion of the multi-section guiding component to achieve better cushioning effect.

BRIEF DESCRIPTION OF THE DRAWINGS

FIG. 2 is a sectional view illustrating the piezoelectric oscillating device according to the first embodiment of the present invention;

FIG. 3 is a sectional view illustrating a piezoelectric oscillating device according to the second embodiment of the present invention;

DETAILED DESCRIPTION OF THE PREFERRED EMBODIMENTS

The implementation of the present invention is described as follows with reference to FIGS. 1 to 4. The descriptions herein are not to be construed as limitations on the present invention, but are to be construed as illustration of the preferred embodiments of the present invention.

Figure 1:
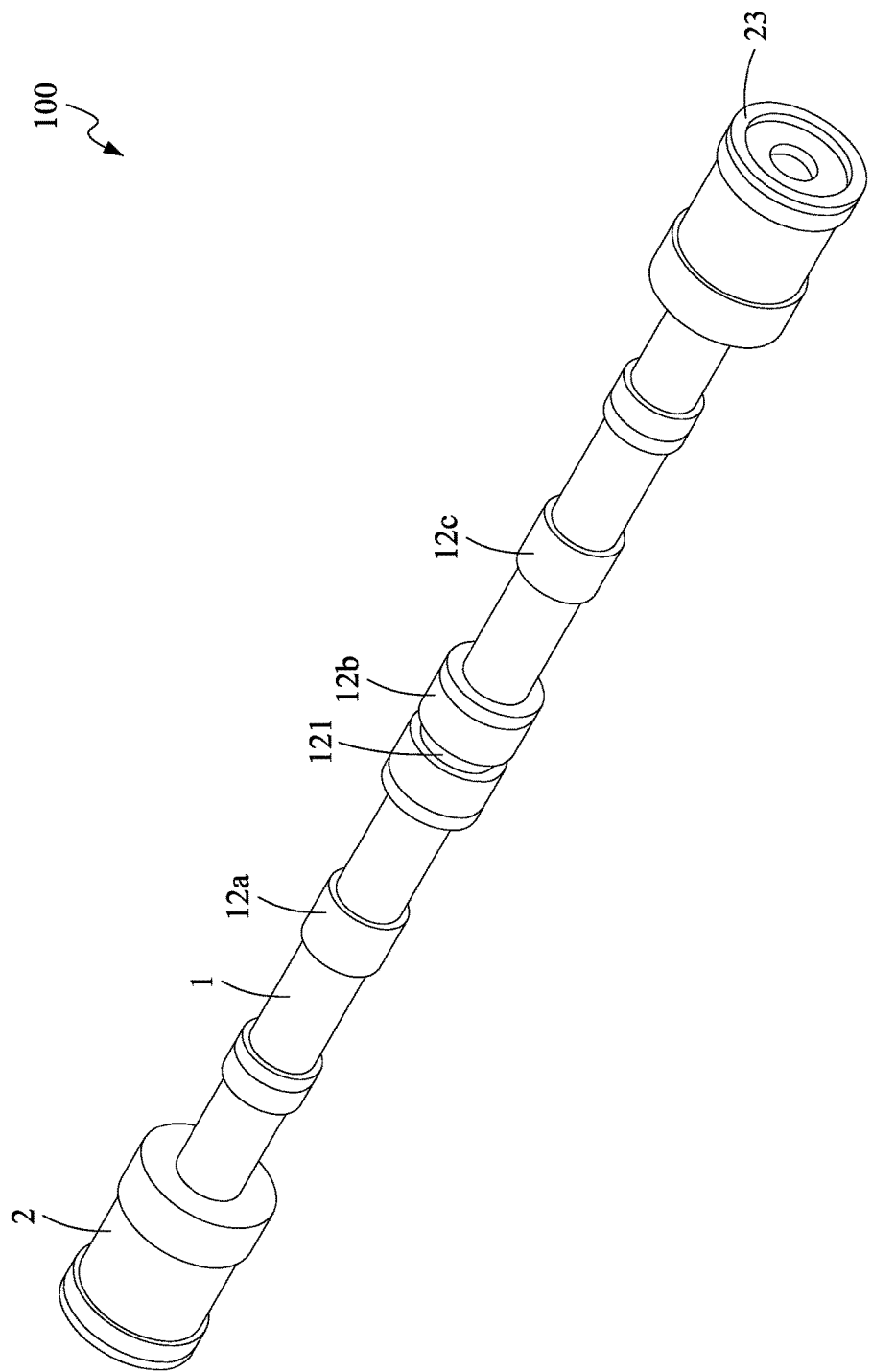
FIG. 1 is a plan view illustrating a piezoelectric oscillating device according to the first embodiment of the present invention.

Please refer to FIGS. 1 and 2. According to the first embodiment of the present invention, a piezoelectric oscillating device 100 comprises a multi-section guiding component 1 and an oscillation generating component 2.

In the present embodiment, the multi-section guiding component 1 is a tubular hollow body, and is made of a thermally conductive material, such as metal, including titanium, stainless steel, aluminum or copper. As shown in FIG. 2, the multi-section guiding component 1 includes a plurality of guiding units 11a, 11b, 11c, and 11d, and each guiding unit 11a, 11b, 11c, and 11d respectively has a hollow space S1, S2, S3, and S4. The plurality of guiding units 11a, 11b, 11c, and 11d are connected together along a longitudinal direction in such a manner that the hollow spaces S1, S2, S3, and S4 are connected in series to form the multi-section guiding component 1, and a guiding channel T is formed inside the multi-section guiding component 1 by connecting the plurality of hollow spaces S1, S2, S3, and S4 in series. In the present embodiment, the plurality of guiding units 11a, 11b, and 11c, and 11d are connected together by welding to form a non-dismantle tubular body, i.e. the multi-section guiding component 1. However, the present invention is not limited to this. The plurality of guiding units 11a, 11b, and 11c, 11d can be connected together by sheathing, screwing or other ways to form a tubular body that can be dismantled.

As shown in FIGS. 1 and 2, the multi-section guiding component 1 further includes a plurality of connecting units 12a, 12b, and 12c, and each connecting units 12a, 12b, and 12c respectively sleeves around ends of two adjacent guiding units 111 such that every two adjacent guiding units are joined by one connecting unit. As shown in FIG. 2, the size of the connecting unit 12b at the central portion of the multi-section guiding component 1 in the longitudinal direction is larger than the sizes of the other two connecting units 12a, 12c, and is connected between the two guiding units 11a, 11c. Moreover, the space formed by the connecting unit 12b communicates between the hollow spaces S2, S3. Besides, for reducing the impact force, the connecting unit 12b is provided with a cushion structure portion 121 which is a concave portion recessed from an outer wall surface of the connecting unit 12 towards an inner wall surface of the connecting unit 12, whereby a wave which is refracted originally through the guiding channel T is diffracted when it travels to the cushion structure portion 121, thereby avoiding an mutual interference of the waves traveling through the rest part of the guiding channel T. Selectively, as shown in the FIG. 3, in other embodiments, a cushion structure portion 121a can be a concave portion recessed from an inner wall surface of the connecting unit towards an outer wall surface of the connecting unit. It is worth mentioning that in the manufacturing process of the piezoelectric oscillating device of the present invention, the cushion structure portion is formed after the plurality of guiding units is connected.

In the present embodiment, the number of the oscillation generating components 2 is two, and the two oscillation generating components 2 are respectively connected to both ends of the multi-section guiding component 1 in the longitudinal direction. Besides, every oscillation generating components 2 includes a housing unit 21, a piezoelectric component 22 and a shielding unit 23.

The housing unit 21 is connected to an end of the multi-section guiding component 1 in the longitudinal direction, and is provided with a sheathing recess portion 211 while the guiding unit 11a at the end of the multi-section guiding component 1 is provided with a sheathed protruding portion 112, wherein the housing unit 21 is connected to the multi-section guiding component 1 by enabling the sheathing recess portion 211 to sheath the sheathed protruding portion 112. However, the present invention is not limited to this. In other embodiments, the housing unit can be formed with a sheathing protruding portion and the multi-section guiding component is formed with a sheathed recess portion in such a manner that the housing unit is connected to the multi-section guiding component by enabling the sheathing protruding portion to sheath the sheathed recess portion. Specifically, the housing unit 21 includes a communication channel which communicates between the disposing space S5 and the guiding channel T in such a manner that the disposing space S5 communicates with the guiding channel T. In the present embodiment, the communication channel includes an extending part 211a and a connecting part 211b, and the extending part 211a is in communication with the guiding channel T and the connecting part 211b communicates between the extending part 211a and the disposing space S5. Moreover, an internal diameter I1 of the extending part 211a is equal to an internal diameter I2 of the guiding channel T, and an internal diameter I3 of the connecting part 211b is less than the internal diameter I1 of the extending part 211a. However, the present invention is not limited to this. In other embodiments, one end of a connecting part is in communication with a disposing space, and the other end of the connecting part extends divergently in width towards an extending part and is connected to the extending part, wherein an internal diameter of the extending part is equal to an internal diameter of a guiding channel, and an internal diameter of the connecting part is no greater than an internal diameter of the extending part.

As shown in FIG. 2, the piezoelectric component 22 is disposed in the disposing space S5 in the housing unit 21, and oscillates via the control of a piezoelectric signal. When the piezoelectric oscillating device 100 is in operation, a piezoelectric controlling device (not shown) which is electrically connected to the piezoelectric component 22 generates a piezoelectric controlling signal to the piezoelectric component 22 in such a manner that the oscillation generating component 2 oscillates in a specific polarization direction.

Figure 4A:
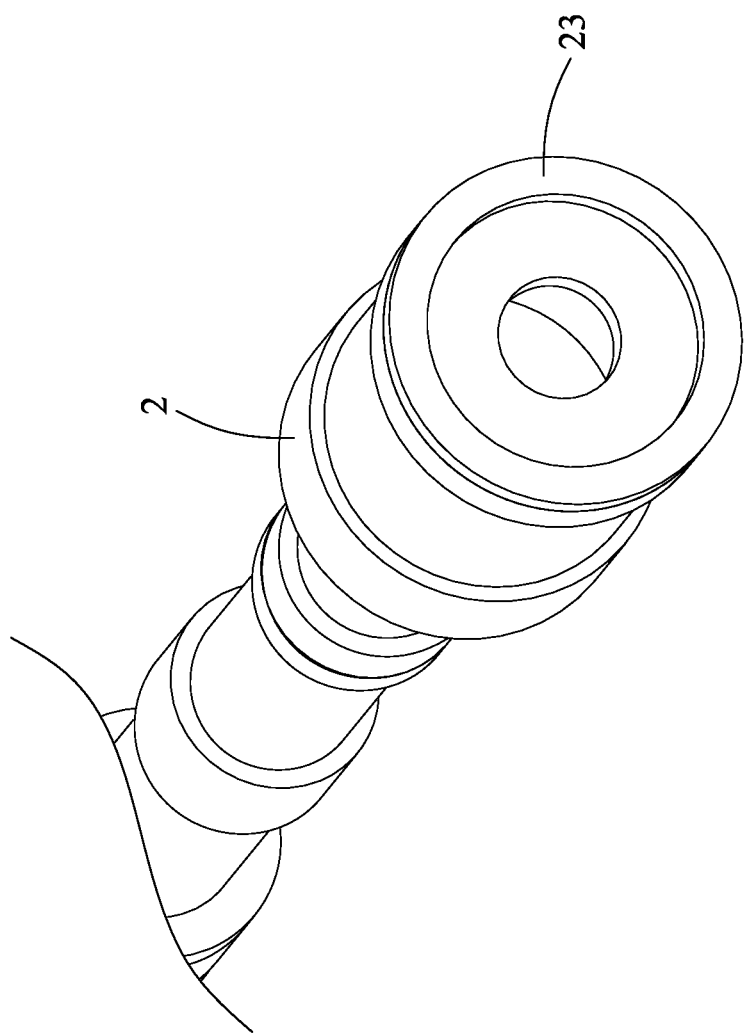
FIG. 4a is a schematic diagram illustrating the piezoelectric oscillating device in which a shielding unit is disposed at an end of an oscillation generating component to cover the disposing space according to the first embodiment of the present invention.
Figure 4B:
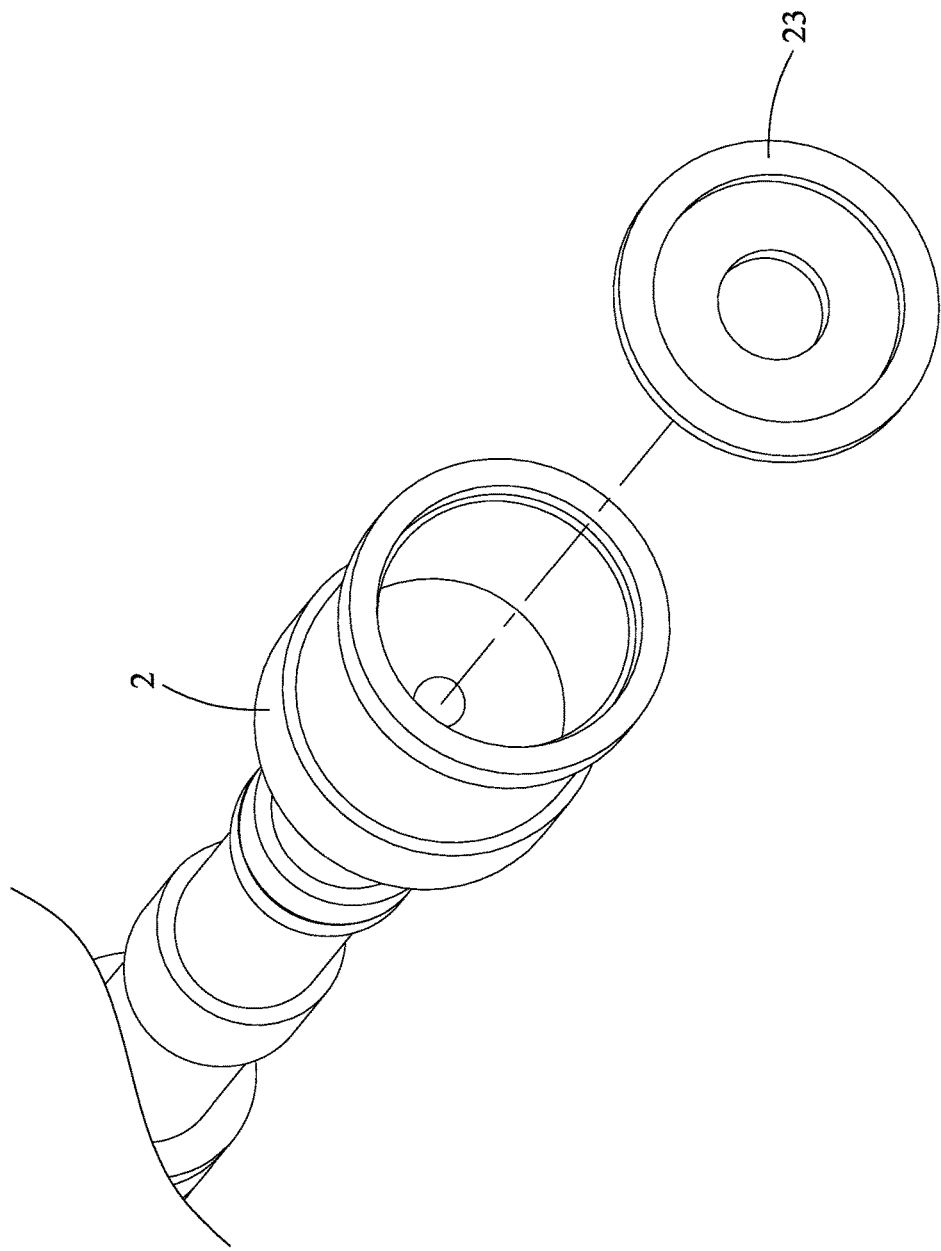
FIG. 4b is a schematic diagram illustrating the piezoelectric oscillating device in which the shielding unit is detached from the oscillation generating component according to the first embodiment of the present invention.

The shielding unit 23 which is waterproof and with a shape corresponding to the disposing space S5 is detachably disposed at an end of the oscillation generating component 2 to cover the disposing space S5. As shown in FIG. 4a, specifically, the shielding unit 23 can be fixed to the oscillation generating component 2 by being screwed or embedded into the oscillation generating component 2. With continuing reference to FIG. 4b, in the present embodiment, the shielding unit 23 is detachable and thereby can be detached from the oscillation generating component 2.

As mentioned above, by the multi-section structure provided in the multi-section guiding component and the cushion structure portion disposed at the central portion of the multi-section guiding component, a powered on piezoelectric oscillating device of the present invention can resonate when receiving piezoelectric signals, and the waveform of a wave traveling through the multi-section guiding component can be altered, by which the power and frequency output from the piezoelectric component are stabilized and the impact force on the piezoelectric oscillating device is thus reduced such that the piezoelectric oscillating device of the present invention achieves a prolonged service life.

The above description is only the explanation of the preferred embodiments of the present invention. However, a person with ordinary skill in the art may make various modifications to the present invention. Those modifications shall still fall within the spirit and the scope defined by the appended claims.

What is claimed is:
1. A piezoelectric oscillating device, comprising:
a multi-section guiding component including a plurality of guiding units, each guiding unit having a hollow space, the plurality of guiding units being connected together along a longitudinal direction in such a manner that the hollow spaces are connected in series to form the multi-section guiding component, and a guiding channel is formed inside the multi-section guiding component by connecting the plurality of hollow spaces in series, and
an oscillation generating component including a housing unit and a piezoelectric component, the housing unit being connected to an end of the multi-section guiding component in the longitudinal direction, the piezoelectric component being disposed in a disposing space in the housing unit and oscillating via a control of a piezoelectric signal,
wherein the housing unit of the oscillation generating component includes a communication channel which communicates between the disposing space and the guiding channel in such a manner that the disposing space communicates with the guiding channel, and the communication channel includes an extending part and a connecting part, the extending part being in communication with the guiding channel and the connecting part communicating between the extending part and the disposing space, wherein an internal diameter of the extending part is equal to an internal diameter of the guiding channel.

2. The piezoelectric oscillating device of claim 1, wherein the multi-section guiding component is provided with a connecting unit which connects the guiding units, and the connecting unit sleeves around ends of two adjacent guiding units such that every two adjacent guiding units are joined by one connecting unit.

3. The piezoelectric oscillating device of claim 2, wherein the connecting unit has a cushion structure portion which is a concave portion recessed from an outer wall surface of the connecting unit towards an inner wall surface of the connecting unit, or recessed from an inner wall surface of the connecting unit towards an outer wall surface of the connecting unit.

4. The piezoelectric oscillating device of claim 3, wherein the cushion structure portion is formed at the central portion of the multi-section guiding component in the longitudinal direction.

5. The piezoelectric oscillating device of claim 1, wherein the disposing space is in communication with atmosphere, and the oscillation generating component includes a shielding unit which is waterproof and with a shape corresponding to the disposing space, and the shielding unit is detachably disposed at an end of the oscillation generating component to cover the disposing space.

6. The piezoelectric oscillating device of claim 1, wherein the number of the oscillation generating components is two, and the two oscillation generating components are respectively connected to both ends of the multi-section guiding component in the longitudinal direction.

7. The piezoelectric oscillating device of claim 1, wherein the communication channel includes an extending part and a connecting part, and the extending part is in communication with the guiding channel and the connecting part communicates between the extending part and the disposing space, wherein one end of the connecting part is in communication with the disposing space, and the other end of the connecting part extends divergently in width towards the extending part and is connected to the extending part, and an internal diameter of the extending part is equal to an internal diameter of the guiding channel, and an internal diameter of the connecting part is no greater than an internal diameter of the extending part.

8. The piezoelectric oscillating device of claim 1, wherein the housing unit of the oscillation generating component includes a sheathing recess portion, and the guiding unit at the end of the multi-section guiding component includes a sheathed protruding portion, the housing unit being connected to the multi-section guiding component by enabling the sheathing recess portion to sheath the sheathed protruding portion.

* * * * *